United States Patent [19]
Chiou

[11] Patent Number: 5,828,553
[45] Date of Patent: Oct. 27, 1998

[54] CPU HEAT SINK FASTENER

[76] Inventor: Ming Chin Chiou, No. 2, Alley 1, Lane 160, Kai De St., Chien Chen Chu, Kau Hsiung City, Taiwan

[21] Appl. No.: 872,054

[22] Filed: Jun. 10, 1997

[51] Int. Cl.[6] .................................................. H05K 7/20
[52] U.S. Cl. ..................... 361/704; 24/458; 174/16.3; 165/80.3; 361/722; 257/718; 257/727
[58] Field of Search ............................ 165/80.3; 439/487; 174/16.3; 361/704, 709, 710, 717–719, 818, 722; 257/705, 718, 727; 24/458

[56] References Cited

U.S. PATENT DOCUMENTS 5,671,118  9/1997  Blomquist ........................ 361/704
5,684,676  11/1997  Lin ................................... 361/704

Primary Examiner—Gerald P. Tolin
Assistant Examiner—Michael Datskovsky
Attorney, Agent, or Firm—Bacon & Thomas

[57] ABSTRACT

A fastener fastened to a CPU mount to hold down a heat sink on a CPU, including a first clamping plate and a second clamping plate respectively hung on two opposite sides of the CPU mount, a stretcher having a first end fastened to the first clamping plate and a second end inserted through a hole in the second clamping plate, and a lever pivoted to the second end of the stretcher and stopped at the second clamping plate and turned between a vertical position in which the fastener is loosened, and a horizontal position in which the fastener is tightened.

4 Claims, 4 Drawing Sheets

CPU HEAT SINK FASTENER

BACKGROUND OF THE INVENTION

The present invention relates to a CPU heat sink fastener adapted for fastening to a CPU mount to hold down a heat sink on a CPU, and more particularly to such a CPU heat sink fastener which can be conveniently tightened and loosened by means of the operation of a lever.

When a heat sink is attached to a CPU in a CPU mount, it must be firmly secured in place so that heat can be efficiently carried away from the CPU through the heat sink. There is known a clamp designed for this purpose. This clamp is made from an elongated metal plate having two opposite ends sloping upwardly outwards in. reversed directions and then bent downwards and terminating in a respective vertical hanging portions. When to install the clamp, much effort should be employed so that the hanging portions can be bent outwards and then hung on a respective retainer block on the CPU mount. Further, when to remove the clamp from the CPU mount, a special tool shall be used.

SUMMARY OF THE INVENTION

The present invention has been accomplished to provide a CPU heat sink fastener which eliminates the aforesaid drawbacks. It is one object of the present invention to provide a CPU heat sink fastener which can be conveniently installed. It is another object of the present invention to provide a CPU heat sink fastener which firmly secures the heat sink in place and protects it against vibration when installed. It is still another object of the present invention to provide a CPU heat sink fastener which can be conveniently dismounted without the use of a tool. To achieve these and other objects of the present invention, there is provided a CPU heat sink fastener fastened to a CPU mount to hold down a heat sink on a CPU which comprises a first clamping plate and a second clamping plate respectively hung on two opposite sides of the CPU mount, a stretcher having a first end fastened to the first clamping plate and a second end inserted through a hole in the second clamping plate, and a lever pivoted to the second end of the stretcher and stopped at the second clamping plate and turned between a vertical position in which the fastener is loosened, and a horizontal position in which the fastener is tightened.

DETAILED DESCRIPTION OF THE PREFERRED EMBODIMENT

Figure 1:
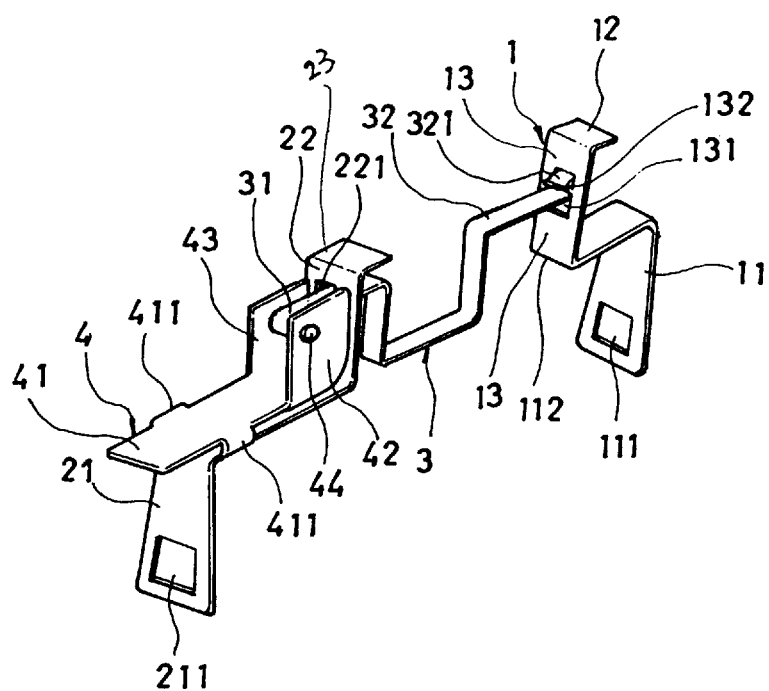
FIG. 1 is an elevational view of a CPU heat sink fastener according to the present invention.
Figure 2:
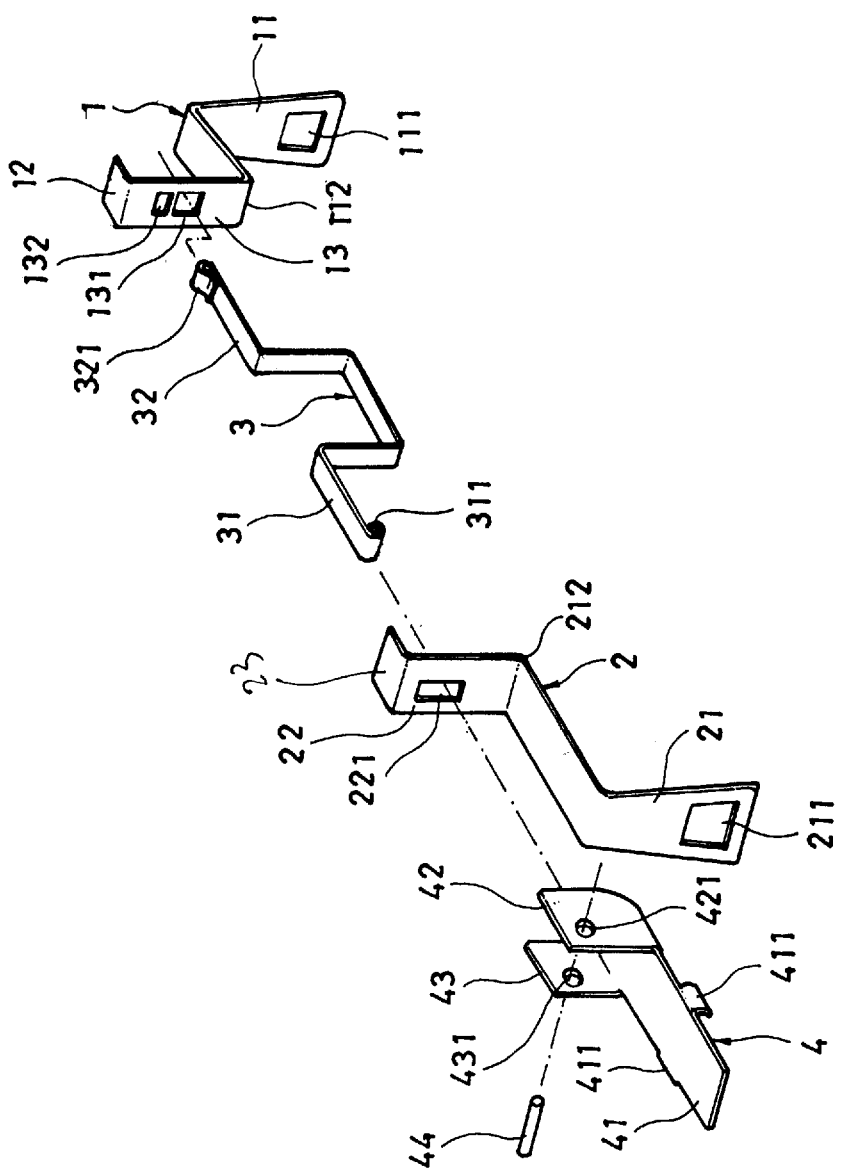
FIG. 2 is an exploded view of the CPU heat sink fastener shown in FIG. 1.

Referring to FIGS. 1 and 2, a CPU heat sink fastener in accordance with the present invention comprises a first clamping plate 1, a second clamping plate 2, a curved stretcher 3, and a lever 4. The first clamping plate 1 comprises a vertical bottom hanging portion 11 at one end, a hanging hole 111 at the hanging portion 11, a horizontal top 12 at an opposite end, and a L-shaped bearing portion 112 connected between the horizontal top 12 and the vertical bottom hanging portion 11 and having a through hole 131 and a retaining hole 132 vertically spaced at its vertical section 13. The second clamping plate 2 comprises a vertical bottom hanging portion 21 at one end, a hanging hole 211 at the hanging portion 21, a horizontal top 23 at an opposite end, and a L-shaped bearing portion 212 connected between the horizontal top 23 and the vertical bottom hanging portion 21 and having a through hole 221 at its vertical section 22. The curved stretcher 3 is made from an elongated resilient metal strip, having two shoulders, namely the first shoulder 31 and the second shoulder 32 respectively extended from two opposite ends of a U-shaped body thereof in reversed directions, wherein the first shoulder 31 terminates in a knuckle 311 which is inserted through the through hole 221 of the second clamping plate 2 and pivoted to the lever 4; the second shoulder 32 terminates in a hook 321 which is inserted through the first through hole 131 of the first clamping plate 1 and then fastened to the retaining hole 132. The lever 4 comprises an elongated flat lever body 41, two parallel lugs 42;43 bilaterally upwardly raised from a front end of the lever body 41 and having a respective pivot hole 421;431 pivotably connected to two opposite ends of the knuckle 311 of the stretcher 3 by a pivot 44, and two springy retaining strips 411 bilaterally downwardly raised from a middle part thereof. The pivot holes 421;431 of the lugs 42;43 are preferably disposed in one corner remote from the lever body 41 and its front end.

Figure 3:
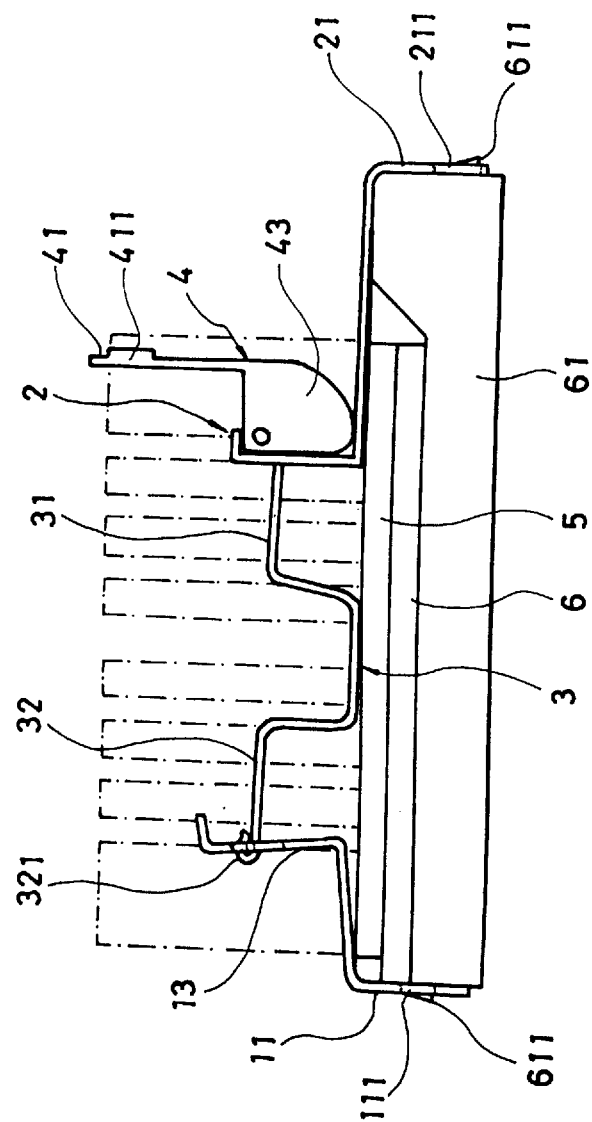
FIG. 3 is an applied view of the present invention, showing the fastener installed, the lever disposed in vertical.
Figure 4:
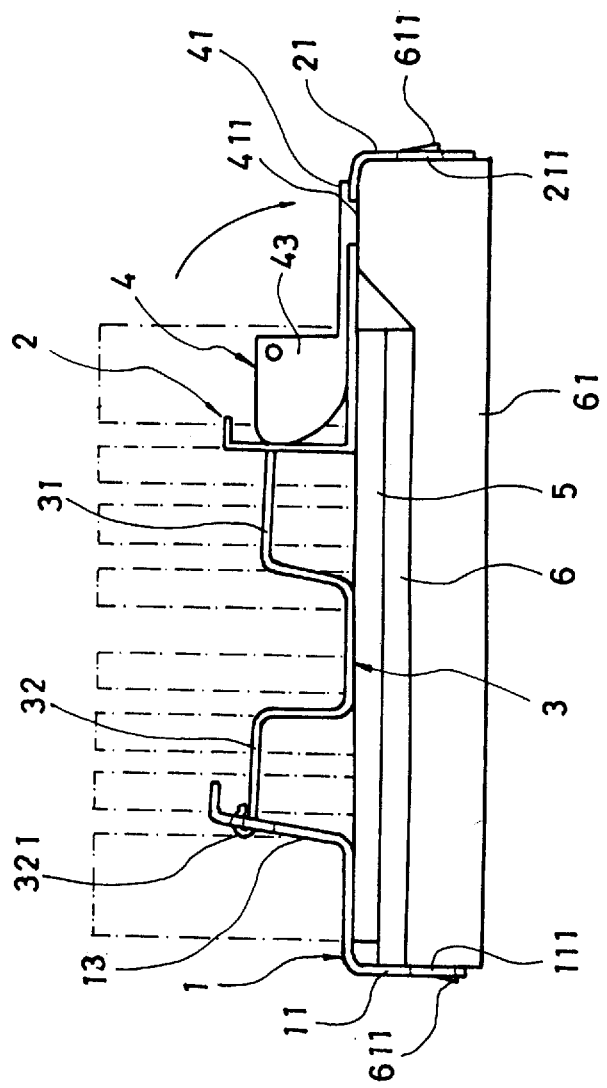
FIG. 4 is similar to FIG. 3 but showing the lever turned to the horizontal position and the fastener tightened.

Referring to FIGS. 3 and 4, when in use, the first and second clamping plates 1;2 and the stretcher 3 are attached to a longitudinal groove on a heat sink 5 above a CPU 6 and a CPU mount 61, then the hanging holes 111;211 of the first and second clamping plates 1;2 are respectively hung on a respective retainer block 611 at two opposite lateral sides of the CPU mount 61 (see FIG. 3). When installed, the lever 4 is pulled downwards from a vertical position shown in FIG. 3 to a horizontal position shown in FIG. 4 and then retained in place by forcing the springy retaining strips 411 into engagement with the L-shaped bearing portion 212 of the second clamping plate 2. When the lever 4 is turned to the horizontal position, the stretcher 3 is stretched, thereby causing the first clamping plate 1 to be pulled toward the second clamping plate 2, and therefore the fastener is tightened. If the CPU is to be replaced, the fastener can be conveniently loosened. and then removed from the heat sink 5 and the CPU mount 61 simply by turning the lever 4 from the horizontal position shown in FIG. 4 to the vertical position shown in FIG. 3. Further, the lugs 42;43 of the lever 4 preferably have a respective smoothly curved contact edge disposed in contact with the second clamping plate 2 so that the lever 4 can be smoothly moved over the surface of the L-shaped bearing portion 212 of the second clamping plate 2.

While only one embodiment of the present invention has been shown and described, it will be understood that various modifications and changes could be made thereunto without departing from the spirit and scope of the invention disclosed.

What the invention claimed is:

1. A fastener fastened to a CPU mount to hold down a heat sink above a CPU, comprising:

a first clamping plate, said first clamping plate comprising a vertical bottom hanging portion attached to one lateral side of said CPU mount, a hanging hole at the hanging portion of said first clamping plate and hung on one retainer block on said CPU mount, a horizontal top at an opposite end, and a L-shaped bearing portion connected between the horizontal top and vertical bottom hanging portion of said first clamping plate and attached to said heat sink at a top side and having a through hole and a retaining hole vertically spaced at a vertical section thereof;

a second clamping plate, said second clamping plate comprising a vertical bottom hanging portion at one end attached to an opposite lateral side of said CPU mount, a hanging hole at the hanging portion of said second clamping plate and hung on one retainer block of said CPU mount, a horizontal top at an opposite end, and a L-shaped bearing portion connected between the horizontal top and vertical bottom hanging portion of said second clamping plate and having a through hole at a vertical section thereof;

a curved stretcher connected between said first clamping plate and said second clamping plate, said curved stretcher comprising a U-shaped body, a first shoulder and a second shoulder respectively and horizontally extended from two opposite ends of said U-shaped body in reversed directions, said first shoulder having one end connected to said U-shaped body and an opposite end terminating in a knuckle inserted through the through hole of said second clamping plate and pivoted to a lever, said second shoulder having one end connected to said U-shaped body and an opposite end terminating in a hook inserted through the first through hole of said first clamping plate and fastened to its retaining hole; and a lever pivoted to the knuckle of the first shoulder of said stretcher and stopped at the vertical section of the L-shaped bearing portion of said second clamping plate and turned between a horizontal position in which the fastener is loosened, and a vertical position in which the fastener is tightened, said lever comprising an elongated flat lever body having a front end, two parallel lugs bilaterally upwardly raised from the front end of said lever body and having a respective pivot hole pivotably connected to two opposite ends of the knuckle of said stretcher by a pivot.

2. The fastener of claim 1, wherein the pivot holes of the lugs of said lever are preferably disposed in one corner remote from said lever body and its front end.

3. The fastener of claim 1, wherein the lugs of said lever have a respective smoothly curved contact edge disposed in contact with said second clamping plate.

4. The fastener of claim 1, wherein said lever further comprises two springy retaining strips bilaterally downwardly raised from a middle part thereof, which are forced into engagement with the L-shaped bearing portion of said second clamping plate when said lever is turned to said horizontal position.

* * * * *